(12) United States Patent
Lin et al.

(10) Patent No.: US 10,446,514 B2
(45) Date of Patent: Oct. 15, 2019

(54) COMBING BUMP STRUCTURE AND MANUFACTURING METHOD THEREOF

(71) Applicant: NANYA TECHNOLOGY CORPORATION, New Taipei (TW)

(72) Inventors: Po-Chun Lin, Changhua County (TW); Chin-Lung Chu, Taoyuan (TW)

(73) Assignee: NANYA TECHNOLOGY CORPORATION, New Taipei (TW)

(*) Notice: Subject to any disclaimer, the term of this patent is extended or adjusted under 35 U.S.C. 154(b) by 0 days.

(21) Appl. No.: 16/048,357

(22) Filed: Jul. 30, 2018

(65) Prior Publication Data

US 2018/0337154 A1 Nov. 22, 2018

Related U.S. Application Data

(62) Division of application No. 15/592,181, filed on May 10, 2017, now Pat. No. 10,068,865.

(51) Int. Cl.
*H01L 23/00* (2006.01)

(52) U.S. Cl.
CPC .............. *H01L 24/13* (2013.01); *H01L 24/10* (2013.01); *H01L 24/11* (2013.01); *H01L 24/16* (2013.01); *H01L 24/04* (2013.01); *H01L 24/05* (2013.01); *H01L 24/81* (2013.01); *H01L 2224/0401* (2013.01); *H01L 2224/05022* (2013.01); *H01L 2224/05073* (2013.01); *H01L 2224/05147* (2013.01); *H01L 2224/05171* (2013.01); *H01L 2224/05558* (2013.01); *H01L 2224/05562* (2013.01); *H01L 2224/05564* (2013.01); *H01L 2224/05572* (2013.01); *H01L 2224/05573* (2013.01); *H01L 2224/05644* (2013.01); *H01L 2224/05647* (2013.01); *H01L 2224/05671* (2013.01); *H01L 2224/10125* (2013.01); *H01L 2224/10126* (2013.01); *H01L 2224/10145* (2013.01); *H01L 2224/11013* (2013.01); *H01L 2224/11472* (2013.01); *H01L 2224/11616* (2013.01); *H01L 2224/12105* (2013.01);

(Continued)

(58) Field of Classification Search
CPC . H01L 2224/10125; H01L 2224/10126; H01L 2224/10145; H01L 2224/13076; H01L 2224/13565; H01L 2224/136–13686; H01L 2224/13078; H01L 2224/1607; H01L 2224/16013
See application file for complete search history.

(56) References Cited

U.S. PATENT DOCUMENTS

| 7,015,590 B2 | 3/2006 | Jeong et al. |
| 7,300,864 B2 | 11/2007 | Ma et al. |

(Continued)

FOREIGN PATENT DOCUMENTS

| EP | 2075834 A1 | 7/2009 | |
| JP | 2009-238806 | * 10/2009 | ............. H01L 21/60 |

(Continued)

*Primary Examiner* — Kevin Parendo
(74) *Attorney, Agent, or Firm* — CKC & Partners Co., LLC

(57) ABSTRACT

A manufacturing method of a combing bump structure is disclosed. In the manufacturing method, a semiconductor substrate is provided, a pad is formed on the semiconductor substrate, a conductive layer is formed on the pad, a solder bump is formed on the conductive layer, and at least two metal side walls are formed disposed along opposing laterals of the solder bump respectively.

4 Claims, 5 Drawing Sheets

(52) U.S. Cl.
CPC ............ *H01L 2224/13006* (2013.01); *H01L 2224/13011* (2013.01); *H01L 2224/13017* (2013.01); *H01L 2224/13019* (2013.01); *H01L 2224/13022* (2013.01); *H01L 2224/13076* (2013.01); *H01L 2224/13078* (2013.01); *H01L 2224/1607* (2013.01); *H01L 2224/16012* (2013.01); *H01L 2224/16105* (2013.01); *H01L 2224/16145* (2013.01); *H01L 2224/81191* (2013.01); *H01L 2224/81815* (2013.01)

(56) References Cited

U.S. PATENT DOCUMENTS

| | | |
|---|---|---|
| 2004/0197979 A1 | 10/2004 | Jeong et al. |
| 2007/0228361 A1 | 10/2007 | Raravikar et al. |
| 2008/0121266 A1* | 5/2008 | Tsunomura ......... H01L 31/0747 |
| | | 136/244 |
| 2012/0091577 A1 | 4/2012 | Hwang et al. |
| 2012/0298758 A1* | 11/2012 | Vishwanath ....... G06K 19/0773 |
| | | 235/492 |
| 2013/0313707 A1 | 11/2013 | Choi et al. |
| 2015/0262920 A1 | 9/2015 | How et al. |
| 2016/0118351 A1 | 4/2016 | Yu et al. |

FOREIGN PATENT DOCUMENTS

| | | |
|---|---|---|
| JP | 2009-238806 A | 10/2009 |
| TW | 200924090 A | 6/2009 |
| TW | 201135884 A1 | 10/2011 |
| TW | 201318957 A1 | 5/2013 |
| WO | 2011/104779 A1 | 9/2011 |

\* cited by examiner

COMBING BUMP STRUCTURE AND MANUFACTURING METHOD THEREOF

RELATED APPLICATIONS

This Application is a Divisional of U.S. application Ser. No. 15/592,181, filed on May 10, 2017.

BACKGROUND

Field of Invention

The present invention relates to a combing bump structure and a manufacturing method thereof.

Description of Related Art

Semiconductor devices are used in a large number of electronic devices, such as computers, cell phones, and others. Semiconductor devices comprise integrated circuits (ICs) that are formed on semiconductor wafers by depositing many types of thin films of material over the semiconductor wafers, and patterning the thin films of material to form the integrated circuits.

The Redistribution Layer (RDL) process is to take the original designed IC's I/O pad and use wafer-level metal wiring process and bumping process to change the IC's contact point position. Bumping is an advanced wafer level process technology where "bumps" or "balls" made of solder are formed on the wafers in a whole wafer form before the wafer is being diced into individual chips.

Nowadays, low cost RDL/Bumping solution popularly processed, but incapable of processing fine-pitch product. PI beneath the bump upon passivation can be good buffer layer, but the weakness of PI is low adhesive strength to others like passivation itself or the metals. Thus, PI sometime easily peels off from the wafer when process is improperly controlled.

SUMMARY

An embodiment of the present disclosure is related to a combing bump structure including a semiconductor substrate; a pad disposed on the semiconductor substrate; a conductive layer disposed on the pad; a solder bump disposed on the conductive layer; and at least two metal side walls disposed along opposing laterals of the solder bump respectively.

Another embodiment of the present disclosure is related to a combing bump structure including a first semiconductor substrate; a first pad disposed on the first semiconductor substrate; a first conductive layer disposed on the first pad; a first solder bump disposed on the first conductive layer; at least two first metal side walls disposed along opposing laterals of the first solder bump respectively; a second semiconductor substrate; a second pad disposed on the second semiconductor substrate; a second conductive layer disposed on the second pad; a second solder bump disposed on the second conductive layer; and at least two second metal side walls disposed along opposing laterals of the second solder bump respectively, and the second solder bump configured to form a solder joint with the first solder bump when the first and second solder bumps are brought together and a reflow process is performed.

Yet another embodiment of the present disclosure is related to a manufacturing method of combing bump structure, the manufacturing method includes providing a semiconductor substrate; forming a pad on the semiconductor substrate; forming a conductive layer on the pad; forming a solder bump on the conductive layer; and forming at least two metal side walls disposed along opposing laterals of the solder bump respectively.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
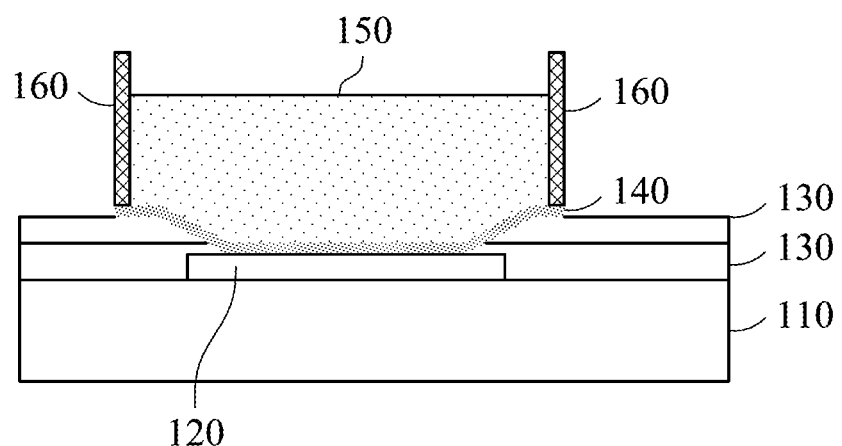
FIG. 1 is a cross-sectional view illustrating a combing bump structure according to some embodiments of the present disclosure.

Reference will now be made in detail to the present embodiments of the invention, examples of which are illustrated in the accompanying drawings. Wherever possible, the same reference numbers are used in the drawings and the description to refer to the same or like parts.

As used in the description herein and throughout the claims that follow, the meaning of "a", "an", and "the" includes reference to the plural unless the context clearly dictates otherwise. Also, as used in the description herein and throughout the claims that follow, the terms "comprise or comprising", "include or including", "have or having", "contain or containing" and the like are to be understood to be open-ended, i.e., to mean including but not limited to. As used in the description herein and throughout the claims that follow, the meaning of "in" includes "in" and "on" unless the context clearly dictates otherwise.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a cross-sectional view illustrating a combing bump structure 100 according to some embodiments of the present disclosure. As shown in FIG. 1, a pad 120 is disposed on the semiconductor substrate 110, and a conductive layer 140 is disposed on the pad 120. Moreover, one or more passivation layers 130 are disposed on the semiconductor substrate 110, the passivation layers 130 have an opening for partially exposing the pad 120, and the conductive layer 140 is in contact with the pad 120 and the passivation layer 130.

In FIG. 1, a solder bump 150 is disposed on the conductive layer 140, and at least two metal side walls 160 are disposed along opposing laterals of the solder bump 150 respectively and are vertically disposed on the conductive layer 140, thereby for enhancing joint strength in follow-up processes.

In structure, a top of any of the metal side walls 160 is higher than a top of the solder bump 160. In other words, a vertical distance $H_1$ between the top of the solder bump 150 and the top surface of the passivation layer 130 is lower than a vertical distance $H_2$ between the top of the metal side wall 160 and the top surface of the passivation layer 130.

In some embodiments, the conductive layer 140 is or includes an under solder bump metallurgy (UBM) layer. For example, the UBM layer may be a composite layer of metal such as chromium followed by copper followed by gold in order to promote improved adhesion (with the chromium) and to form a diffusion barrier layer or to prevent oxidation (the gold over the copper).

Figure 2:
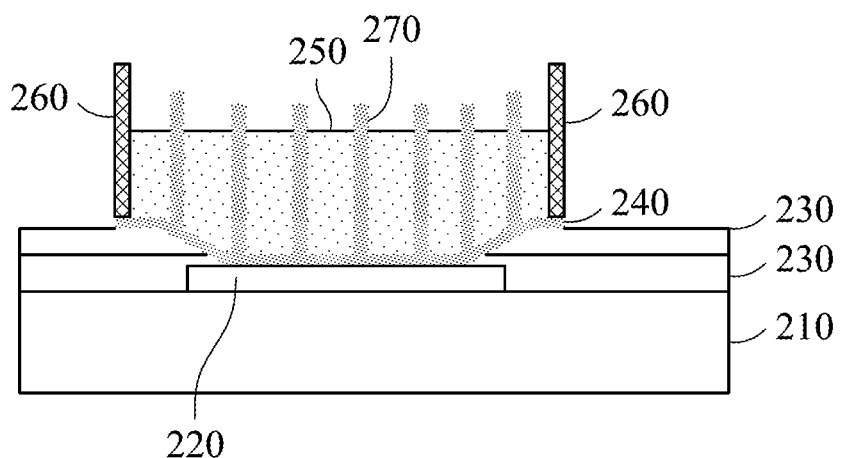
FIG. 2 is a cross-sectional view illustrating a combing bump structure according to some embodiments of the present disclosure.

FIG. 2 is a cross-sectional view illustrating a combing bump structure 200 according to some embodiments of the present disclosure. As shown in FIG. 2, a pad 220 is disposed on the semiconductor substrate 210, and a conductive layer 240 is disposed on the pad 220. Moreover, one or more passivation layers 230 are disposed on the semiconductor substrate 210, the passivation layers 230 have an opening for partially exposing the pad 220, and the conductive layer 240 is in contact with the pad 220 and the passivation layer 230.

In FIG. 2, a solder bump 250 is disposed on the conductive layer 240, and at least two metal side walls 260 are disposed along opposing laterals of the solder bump 250 respectively and are vertically disposed on the conductive layer 240, thereby enhancing joint strength in follow-up processes.

Furthermore, metal pins 270 are disposed in the solder bump 250 and are protruded from the conductive layer 240 for further enhancing joint strength in follow-up processes. In some embodiments, a melting temperature of the metal side walls 260 is higher than a melting temperature of the metal pins 270.

In structure, a top of any of the metal pins 270 is higher than a top of the solder bump 250. In other words, a vertical distance $H_3$ between the top of the solder bump 150 and the top surface of the passivation layer 130 is lower than a vertical distance $H_4$ between the top of the metal pin 270 and the top surface of the passivation layer 130. Moreover, the top of any of the metal pins 270 can be lower than the top of any of the metal side walls 260.

Figure 3A:
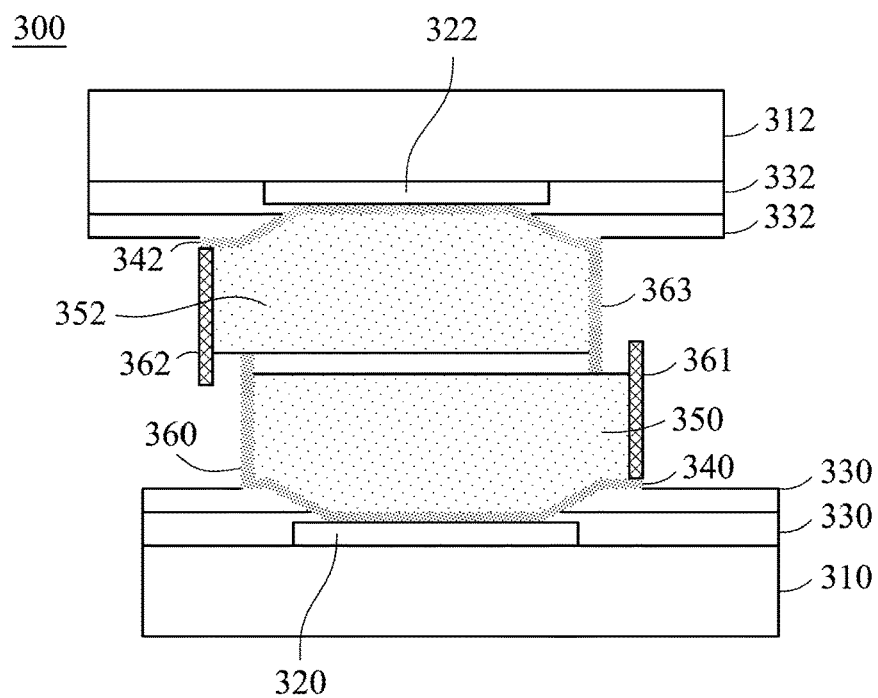
FIGS. 3A and 3B are cross-sectional views illustrating a combing bump structure before and after joint according to some embodiments of the present disclosure.
Figure 3B:
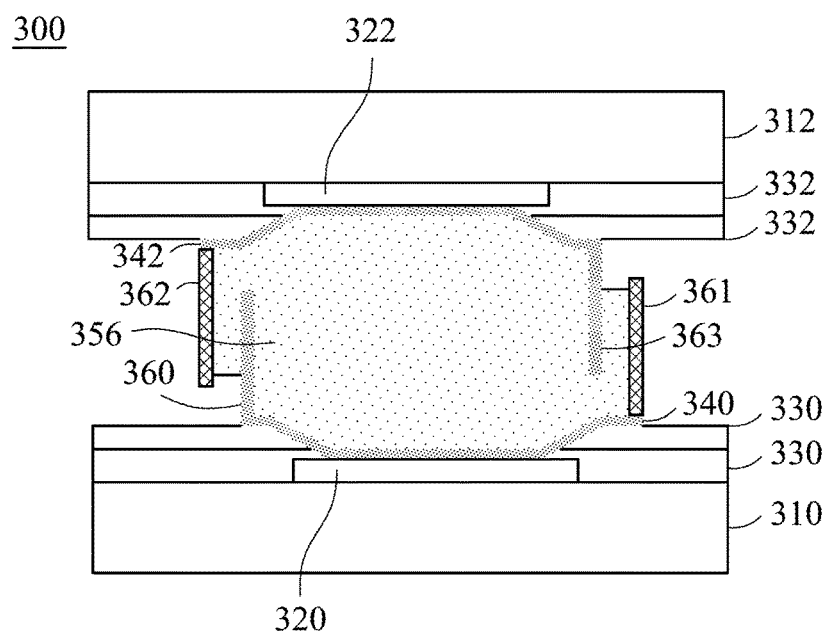

FIGS. 3A and 3B are cross-sectional views illustrating a combing bump structure before and after joint according to some embodiments of the present disclosure. As shown in FIG. 3A, a first pad 320 is disposed on the first semiconductor substrate 310, and a first conductive layer 340 is disposed on the first pad 320. One or more first passivation layers 330 are disposed on the first semiconductor substrate 310. A first solder bump 350 is disposed on the first conductive layer 340, and at least two first metal side walls 360 and 361 are disposed along opposing laterals of the first solder bump 350 respectively.

Moreover, In FIG. 3A, a second pad 322 is disposed on the second semiconductor substrate 312, and a second conductive layer 342 is disposed on the second pad 322. One or more second passivation layers 332 are disposed on the second semiconductor substrate 312. A second solder bump 352 is disposed on the second conductive layer 342, and at least two second metal side walls 362 and 363 are disposed along opposing laterals of the second solder bump 352 respectively.

The second solder bump 352 is configured to form a solder joint 356 (shown in FIG. 3B) with the first solder bump 350 when the first and second solder bumps 350 and 352 are brought together and a reflow process is performed. A vertical distance $H_5$ between the first pad 320 and the second pad 322 is higher than a vertical length $H_6$ of any (such as the second metal side wall 363) of metal side walls 360-363.

As shown in FIG. 3B, the first metal side wall 360 is disposed in the solder joint 356 and is positioned between the two second metal side walls 362 and 363. The second metal side wall 363 is disposed in the solder joint 356 and is positioned between the two first metal side walls 360 and 361. In some embodiments, a melting temperature of the first and second metal side walls 360 and 363 is lower than a melting temperature of the first and second metal side walls 361 and 362.

Figure 4A:
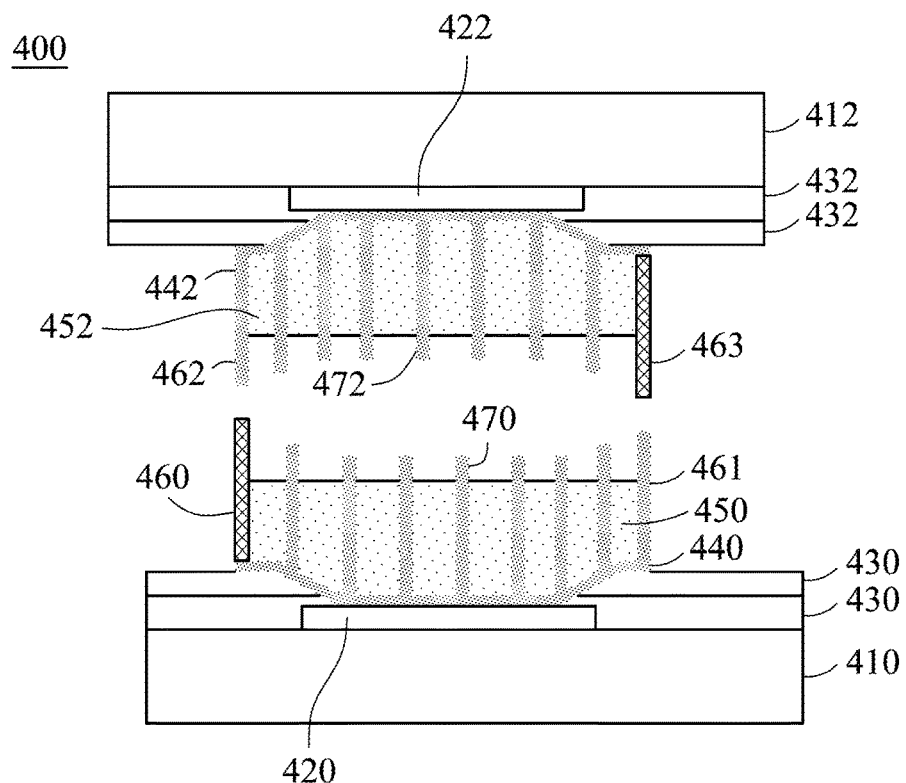
FIGS. 4A and 4B are cross-sectional views illustrating a combing bump structure before and after joint according to some embodiments of the present disclosure.
Figure 4B:
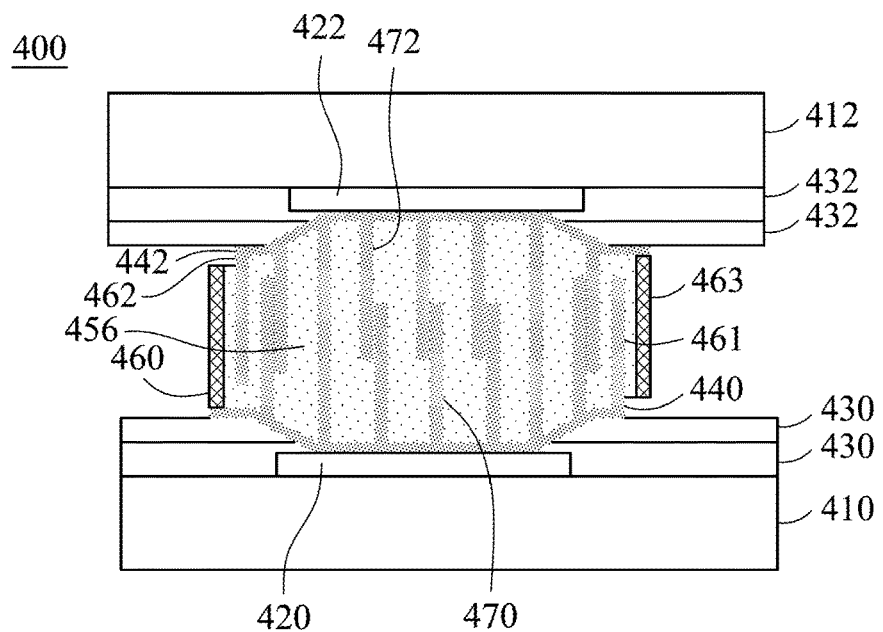

FIGS. 4A and 4B are cross-sectional views illustrating a combing bump structure before and after joint according to some embodiments of the present disclosure. As shown in FIG. 4A, a first pad 420 is disposed on the first semiconductor substrate 410, and a first conductive layer 440 is disposed on the first pad 320. One or more first passivation layers 430 are disposed on the first semiconductor substrate 410. A first solder bump 450 is disposed on the first conductive layer 440, at least two first metal side walls 460 and 461 are disposed along opposing laterals of the first solder bump 450 respectively, and first metal pins 470 are disposed in the first solder bump 450 and are protruded from the first conductive layer 440.

Moreover, In FIG. 4A, a second pad 422 is disposed on the second semiconductor substrate 412, and a second conductive layer 442 is disposed on the second pad 422. One or more second passivation layers 432 are disposed on the second semiconductor substrate 412. A second solder bump 452 is disposed on the second conductive layer 442, at least two second metal side walls 462 and 463 are disposed along opposing laterals of the second solder bump 452 respectively, and second metal pins 472 are disposed in the second solder bump 452 and are protruded from the second conductive layer 442.

The second solder bump 452 is configured to form a solder joint 456 (shown in FIG. 4B) with the first solder bump 450 when the first and second solder bumps 450 and 452 are brought together and a reflow process is performed.

As shown in FIG. 4B, the first and second metal pins 470 and 472 are alternately arranged in the solder joint 456. The first metal side wall 461 is disposed in the solder joint 456 and is positioned between the two second metal side walls 462 and 463. The second metal side wall 462 is disposed in the solder joint 456 and is positioned between the two first metal side walls 460 and 361. In some embodiments, a melting temperature of the first and second metal side walls 461 and 462 and the first and second metal pins 470 and 472 is lower than a melting temperature of the first and second metal side walls 460 and 463.

FIGS. 5A to 5F are cross-sectional views illustrating sequential processes for manufacturing a combing bump structure according to some embodiments of the present disclosure. It is understood that additional operations can be provided before, during, and after the processes shown by FIGS. 5A to 5F, and some of the operations described below can be replaced or skipped, for additional method embodiments. The order of the operations/processes may be interchangeable.

Figure 5A:
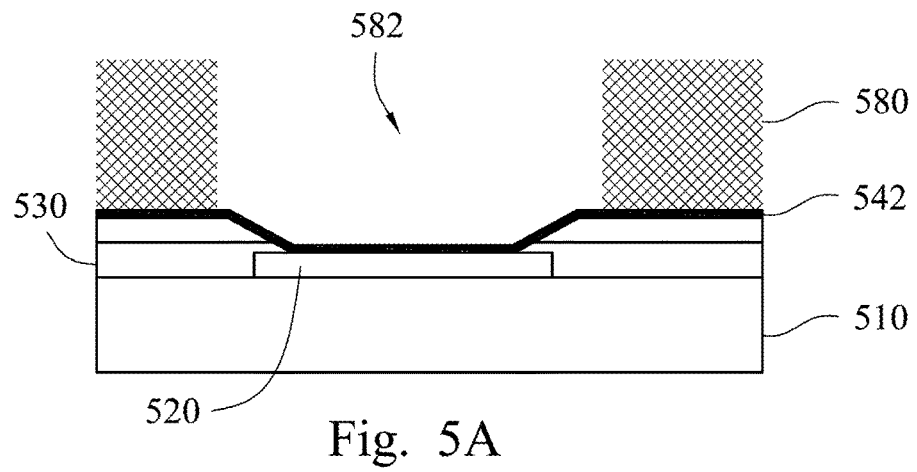
FIGS. 5A to 5F are cross-sectional views illustrating sequential processes for manufacturing a combing bump structure according to some embodiments of the present disclosure.

As shown in FIG. 5A, a semiconductor substrate 510 is provided. A pad 520 is formed on the semiconductor substrate 510, and one or more passivation layers 530 are formed on the semiconductor substrate 510. The passivation layers 530 partially expose the pad 520, and the UBM layer 540 is formed in contact with the pad 520 and the passivation layer 530. A photoresist 580 is formed on the UBM layer 542. The photoresist 580 may be exposed and developed to form a first opening 582. The first opening 582 may expose a portion of the UBM layer 542 on the pad 520.

Figure 5B:
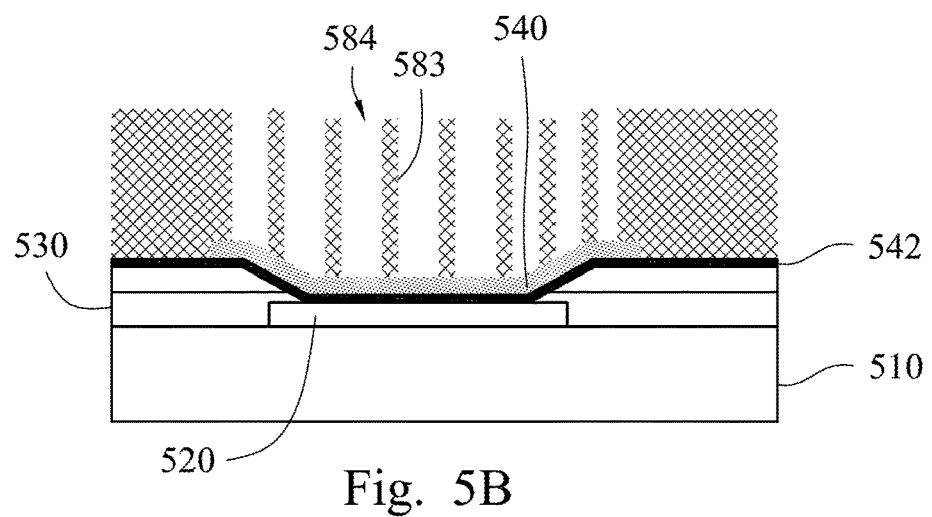

As shown in FIG. 5B, a conductive layer 540 is formed on the above-mentioned portion of the UBM layer 542. The photoresist 583 is formed on the conductive layer 540. The photoresist 583 may be exposed and developed to form second openings 584. The second openings 584 may expose a portion of the on the conductive layer 540 on the UBM layer 542.

Figure 5C:
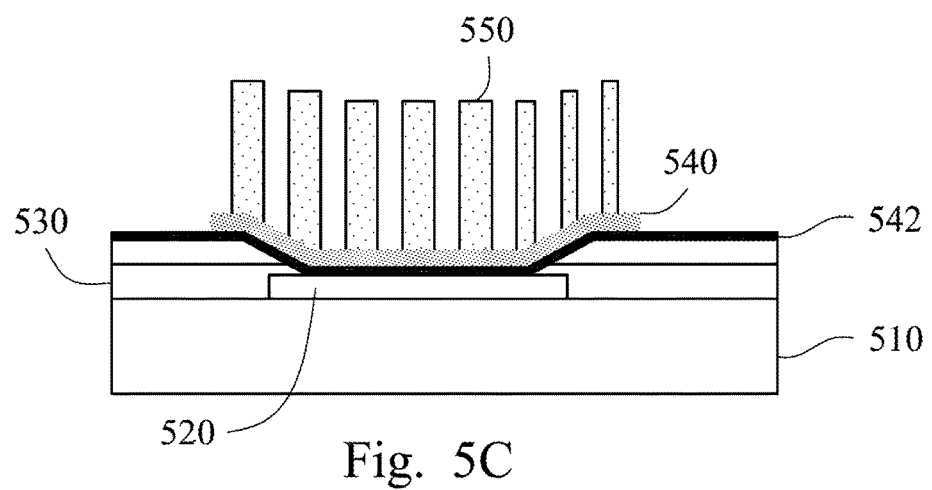

As shown in FIG. 5C, a solder bump 550 is formed on the conductive layer 540 and is positioned corresponding to the above-mentioned second openings 584.

Figure 5D:
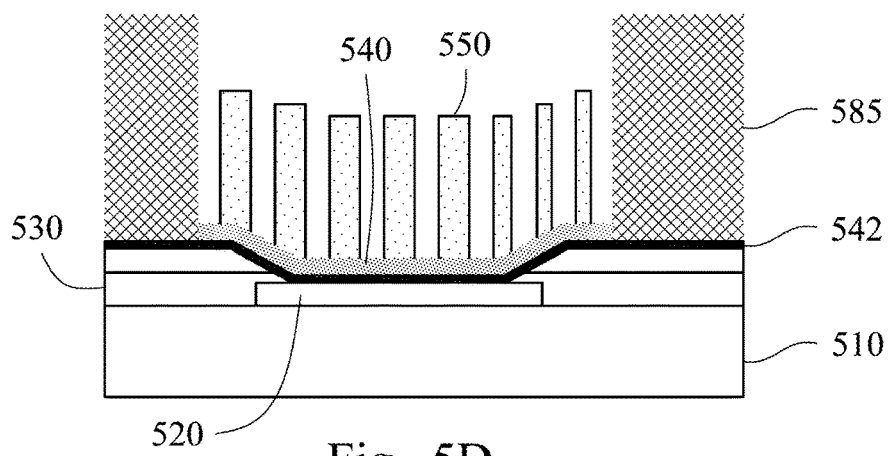

As shown in FIG. 5D, a photoresist 585 is formed on the UBM layer 542.

Figure 5E:
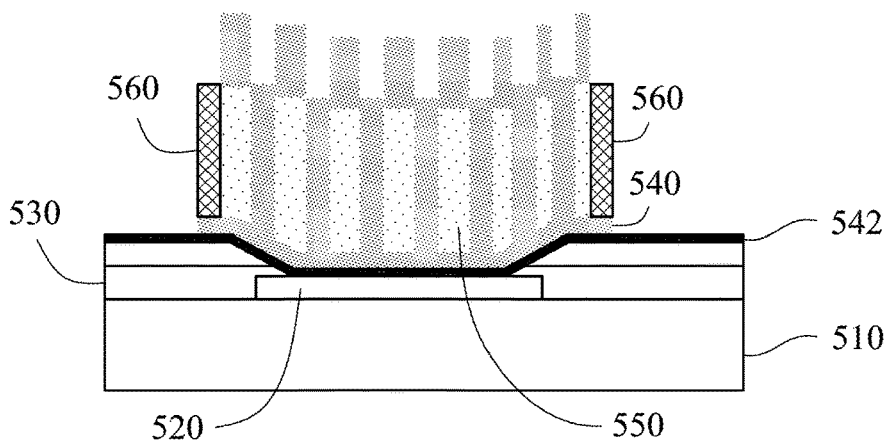

As shown in FIG. 5E, metal side walls 560 are formed along outer laterals of the solder bump 550 respectively, and metal pins 570 are formed on the conductive layer 540 and arranged in the solder bump 550.

Figure 5F:
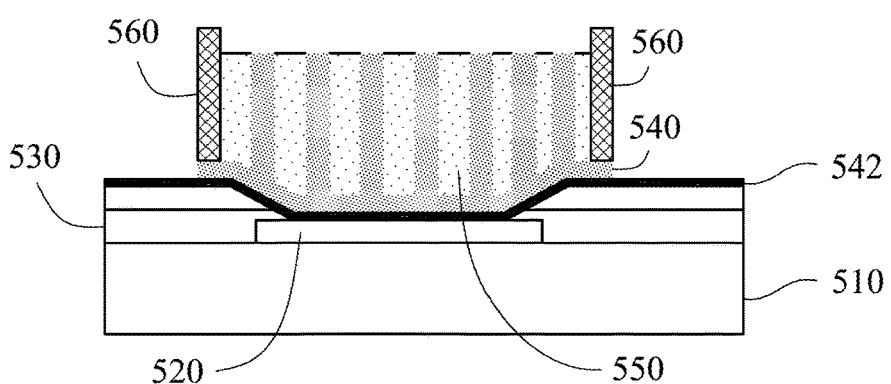

As shown in FIG. 5F, redundant portions of the solder bump 550, metal side walls 560 and metal pins 570 are removed. For example, tips of the solder bump 550, metal side walls 560 and metal pins 570 are polished by using a chemical-mechanical planarization (CMP) process, so as to remove the redundant portions.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A manufacturing method of a combing bump structure, the manufacturing method comprising:
    providing a first semiconductor substrate;
    forming a first pad on the first semiconductor substrate;
    forming a first conductive layer on the first pad;
    forming a first solder bump on the first conductive layer; and
    forming at least two first metal side walls disposed along opposing outer side walls of the first solder bump respectively;
    providing a second semiconductor substrate;
    forming a second pad on the second semiconductor substrate;
    forming a second conductive layer on the second pad;
    forming a second solder bump on the second conductive layer; and
    forming at least two second metal side walls disposed along opposing outer side walls of the second solder bump respectively, and the second solder bump configured to form a solder joint with the first solder bump when the first and second solder bumps are brought together and a reflow process is performed,
    wherein one of the two first metal side walls is disposed in the solder joint and positioned between the two second metal side walls,
    wherein one of the two second metal side walls is disposed in the solder joint and positioned between the two first metal side walls,
    wherein a melting temperature of the one of the two first metal side walls and the one of the two second metal side walls is lower than a melting temperature of the other of the two first metal side walls and the other of the two second metal side walls.

2. The manufacturing method of claim 1, wherein a top of any of the first metal side walls is higher than a top of the first solder bump.

3. The manufacturing method of claim 1, further comprising:
    forming a plurality of first metal pins protruded from the first conductive layer and arranged in the first solder bump.

4. The manufacturing method of claim 3, wherein a melting temperature of the first metal side walls is higher than a melting temperature of the first metal pins.

* * * * *